United States Patent
Chambers et al.

Patent Number: 6,040,788
Date of Patent: Mar. 21, 2000

[54] CACHE BASED SCAN MATRIX KEYBOARD CONTROLLER

[75] Inventors: Peter Chambers; Omer Lem Wehunt, Jr., both of Phoenix, Ariz.

[73] Assignee: VLSI Technology, Inc., San Jose, Calif.

[21] Appl. No.: 09/010,217

[22] Filed: Jan. 21, 1998

[51] Int. Cl.[7] .................................................. H03M 11/00
[52] U.S. Cl. ............................. 341/26; 341/20; 341/22; 345/168; 400/62
[58] Field of Search .................................. 341/26, 20, 22, 341/24; 340/825.79; 345/8; 400/62

[56] References Cited

U.S. PATENT DOCUMENTS

| | | | |
|---|---|---|---|
| 3,643,254 | 2/1972 | Proebsting | 341/22 |
| 3,924,722 | 12/1975 | Wienhold | 341/22 |
| 4,068,226 | 1/1978 | Bowman | 341/26 |
| 4,231,016 | 10/1980 | Ueda | 340/825.89 |
| 4,509,138 | 4/1985 | Hayashi | 341/20 |
| 5,406,273 | 4/1995 | Nishida | 345/168 |
| 5,410,305 | 4/1995 | Barrus | 341/22 |
| 5,574,447 | 11/1996 | Rpylnce | 341/22 |
| 5,717,428 | 2/1998 | Barus | 345/168 |

Primary Examiner—Michael Horabik
Assistant Examiner—Albert K. Wong
Attorney, Agent, or Firm—Wagner, Murabito & Hao LLP

[57] ABSTRACT

The present invention comprises a cache based scan matrix keyboard controller system. The cache based scan matrix keyboard controller system includes a plurality of keys on a keyboard adapted to signal when a key is activated. The cache based scan matrix keyboard controller system also includes a cache memory component and a state machine. The cache memory component stores information regarding the keys for a period of time. The state machine is adapted to interpret the information in the cache memory component to efficiently control said keyboard in a manner that minimizes reliance on CPU processing and reduces expenditure of design, manufacturing and operating resources.

18 Claims, 5 Drawing Sheets

CACHE BASED SCAN MATRIX KEYBOARD CONTROLLER

TECHNICAL FIELD

The present invention relates to the field of keyboards. More particularly, the present invention relates to a cache based scan matrix controller for a keyboard.

BACKGROUND ART

Computer systems and various other devices or systems typically have some method of interacting with users. Usually, this interaction involves the user inputting data or instructions into the computer system. One of the most common devices utilized for inputting data or instructions into a computer system is a keyboard. Normally the keyboard is a peripheral device, coupled to a computer system by external wiring. The external wiring is usually connected to a communication port in a case or "tower" containing the Central Processing Unit (CPU). However, a keyboard is sometimes an integral component of a computer case. For example, lap top or portable computers usually have a self contained keyboard as an integral part of the system.

As the name suggests, keyboards usually include a number of keys or buttons arranged in a particular pattern or specific order on a board. Typically the keys are arranged in an array of rows and columns. The keys represent characters or a function, such as: letters in the alphabet, numbers, punctuation characters, backspace, delete, page up, etc. Sometimes, the user has to activate a number of keys in a particular sequence or simultaneously to achieve a desired result. For example, some computer systems will initiate a soft boot by activating (pressing) the control key, alt key and delete key simultaneously.

The keys are essentially switches that are activated by applying a force, such as pressing on the key with a finger. When a key is activated, an electrical signal representing a specific piece of information (i.e. a keycode representing a letter or number) is allowed to pass through the switch. Keyboards for electronic devices such as computers have traditionally been based on embedded microcontrollers, requiring large amounts of silicon circuitry combined with external memory.

Figure 1:
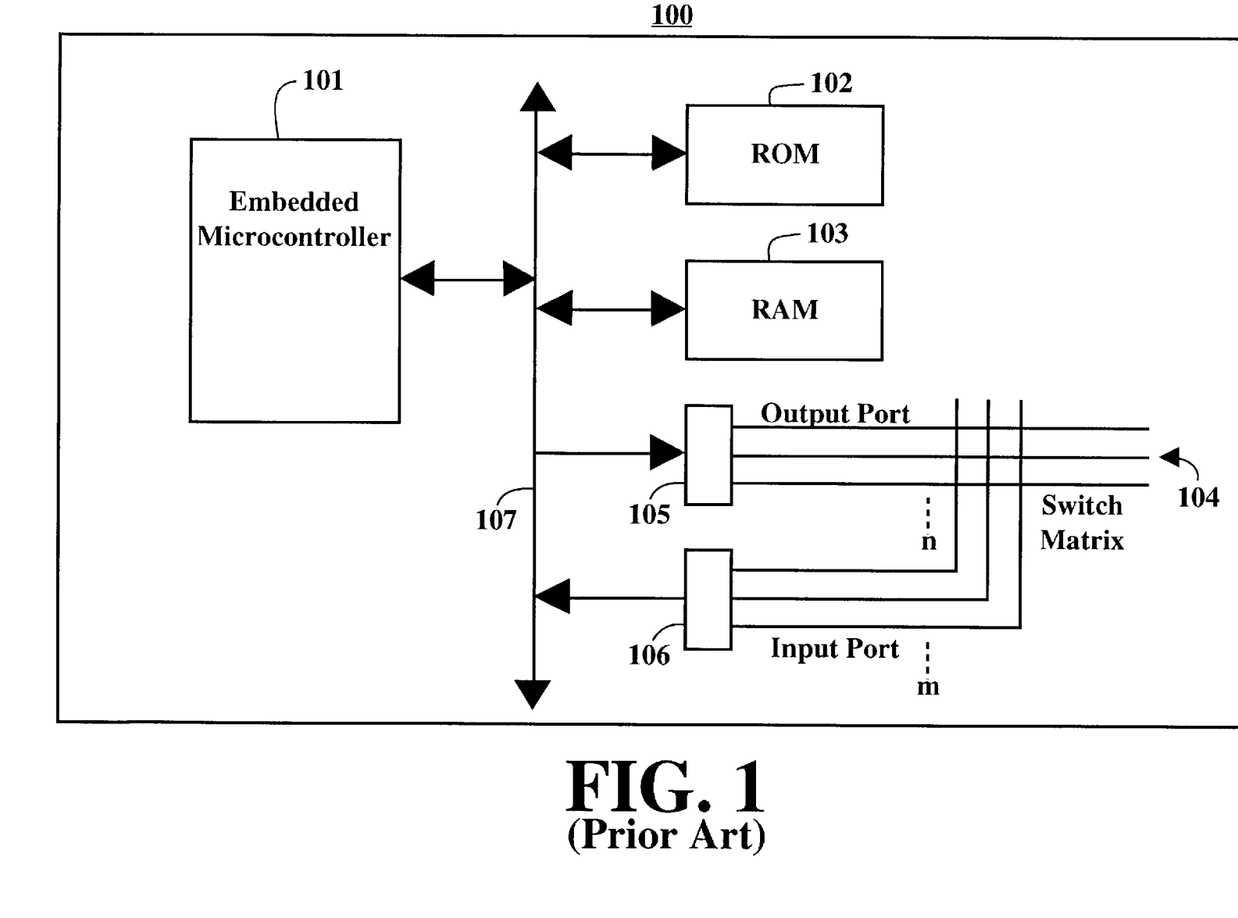
FIG. 1 shows a prior art traditional keyboard system 100.

Prior Art FIG. 1 shows a typical schematic for a traditional keyboard system 100. Traditional keyboard system 100 comprises an embedded microcontroller 101, a read only memory (ROM) 102, a random access memory (RAM) 103, a switch matrix 104, an output port 105, an input port 106 and a communication bus 107. Embedded microcontroller 101 is a microprocessor separate and distinct from a computer system's CPU. Switch matrix 104 is a plurality of switches organized as a n by m matrix of n rows and m columns. Each row and each column comprises an electrically conductive line (hereafter referred to as a line). A switch is coupled to the lines at the intersection of each row and column. Each switch is coupled to a key and each switch is adapted to be activated (closed) when a key is pressed.

The traditional keyboard system 100 operates by generating a scan series of signals, in which each switch is accessed, in turn, to determine if it has been activated. Signals are driven on the output port 105 and connections are received back on the input port 106. Embedded microcontroller 101 directs signals from output port 105 to be sequentially driven low on each row. At the same time, input port 106 scans each column sequentially to determine if the signal on a column is low. When input port 106 senses a low signal is on a particular column it signals embedded microcontroller 101. Embedded microcontroller 101 is programmed to recognize that the switch coupling a row and column must be activated if the signals on the row and column are low. Thus, by determining which switch is activated the traditional keyboard system 100 knows which particular key is pushed.

The architecture of the traditional keyboard system 100 has undesirable characteristics and attributes. For example, keyboard architectures as shown in FIG. 1 can require tens of thousands of silicon gates to be incorporated in the embedded microcontroller 101, ROM 102, and RAM 103. These silicon gates in turn require more power to operate. Embedded microcontroller 101 is a microprocessor that requires software programs to operate, which in turn require resources to be expended in developing the software and troubleshooting the system. Usually the ROM 102 and RAM 103 are external to the chip which contains the embedded microcontroller 101. This greatly increases the number of pins required to communicate addresses and associated data between embedded microcontroller 101 and ROM 102 or RAM 103. Thus, the typical prior art keyboard system requires significant development time for design and an extensive hardware and software verification effort.

What is required is a keyboard system that minimizes the amount of manufacturing resources while maintaining sufficient features in an efficient, flexible and scaleable manner. In such a keyboard system, the number of silicon gates required to operate the keyboard system and power consumed by the components of the keyboard system should be reduced. Further, in such a keyboard system there should be a minimal amount of resources required for software development. The amount of CPU support needed for the keyboard system to function should be decreased. The keyboard system should maintain features such as; debounce of switch noise, "n-key rollover" support, typematic support, any-key resume with first key pressed, full power management, programmable keyboard scan rate, and scaleable design for any size keyboard.

SUMMARY OF THE INVENTION

The present invention is a cache based scan matrix keyboard controller system and method that minimizes the amount of resources expended designing, building and operating the system while maintaining a wide variety of features in an efficient, flexible and scaleable manner. The number of silicon gates required to operate a cache based scan matrix keyboard controller system and the power consumed by its components are less than that required by prior art. The cache based scan matrix keyboard controller system and method may be implemented with no software programming. The amount of processing support needed for a cache based scan matrix keyboard controller system to function is less than a traditional keyboard system. In addition, the present invention supports a wide variety of features, including, debounce of switch noise, n-key rollover support, typematic support, any-key resume with first key pressed, full power management, programmable keyboard scan rate, and scaleable design for any size keyboard.

One embodiment of the present invention comprises a cache based scan matrix keyboard controller system with a plurality of keys on a keyboard adapted to signal when a key is activated. A cache memory component stores information regarding the keys for a period of time. The information stored in the cache memory component is utilized by a state machine to determine an appropriate signal to transmit to other components, such as a central processing unit in a computer system.

DESCRIPTION OF THE DRAWINGS

The accompanying drawings which are incorporated in and form a part of this specification, illustrate embodiments of the invention and together with the description, serve to explain the principles of the invention.

Prior Art

BEST MODE FOR CARRYING OUT THE INVENTION

Reference will now be made in detail to the preferred embodiments of the invention, a cache based scan matrix keyboard controller system and method, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one ordinarily skilled in the art that the present invention may be practiced without these specific details. In other instances, well known methods, procedures, components, and circuits have not been described in detail so as not to unnecessarily obscure aspects of the current invention.

The present embodiment of the cache based scan matrix keyboard controller system comprises cache memory and state machine features. It does not require a dedicated microprocessor, nor does it utilize ROM or RAM resources to operate the keyboard. Thus, the number of silicon gates required for the present embodiment is orders of magnitude smaller than prior art, such as a traditional keyboard system 100. The reduction of the amount of silicon gates is one advantage of the cache based scan matrix keyboard controller architecture, and by eliminating silicon gates less power is consumed. In addition, the present embodiment scans a switch matrix all in hardware and requires no software, thus saving resources that would otherwise be expended in developing and troubleshooting software. The present embodiment does not require central processing unit (CPU) support in standby and only minimal CPU support when fully operational. The cache based scan matrix keyboard controller system maintains the ability to handle a wide variety of features efficiently, flexibly and is scaleable. The wide variety of features supported by a cache based scan matrix keyboard controller system includes: debounce of switch noise, typematic capability, programmable scan rates, standby mode, any-key resume, and N-key rollover.

The cache based scan matrix keyboard controller system accomplishes debounce of switch noise in hardware by using a cache based architecture. Switch noise occurs when a switch sends multiple make and break signals to the CPU even though the key is only pressed once. For example, when a mechanical key is pressed it actually bounces, making and breaking several times. When a key is pressed and the corresponding switch bounces only the initial make event should trigger a signal to the CPU in order to avoid erroneous duplicate signals. Without a debounce capability, a signal for each make and break may be sent to the CPU instead of only one intended signal. The present embodiment debounces switch noise so that only one make and break signal is sent when a key is pressed or released, unless the key is intentionally held down for an extended period of time.

The cache based scan matrix keyboard controller system has a typematic support feature with programmable typematic delay. A typematic support feature permits a user to generate multiple make and break signals without having to repeatedly press and release a key. The user holds down a particular key for as long as a repeated signal is desired. For example, on most computer systems if a letter key (e.g., letter "b") is held down, the signal indicating a character is being triggered, repeats itself and a series of the same letter is generated (i.e., bbbbbbbbb).

The cache based scan matrix keyboard controller system supports programmable scan rates for different key switch technologies and matrix configurations. The programmable scan rate permits the speed at which the keys are scanned to be varied. Different key switch technologies (such as, electrical, mechanical, or capacitive) may require different scan rates. For example, mechanical switches typically require a longer scan rate than electrical switches.

The present embodiment also provides an any-key resume function, with transmission of the first key pressed. The any-key resume is typically utilized in computer systems that have a power managed state (or standby mode). In power managed state the computer system suspends certain operations in order to conserve power. A power managed state is often utilized when there has been no activity, particularly with respect to the keyboard. If the computer system has an any-key resume function, hitting any key generates a "wake" event for the computer system to bring it out of a suspended state. The any-key resume function detects when a key has been pressed and causes an interrupt that triggers all suspended activities to become active again. Some systems support any-key resume but they loose the first key pressed. The present embodiment captures the first key pressed and remembers it long enough to transmit a signal to the central processing unit indicating the character or function associated with an initially pressed key.

The cache based scan matrix keyboard controller system supports N-key rollover. N-key rollover permits the simultaneous use of N keys at a time to indicate a particular function or character. For example, many personal computers may be soft booted (booted up without turning the power completely off) by pressing the "Control—Alt—Delete" keys simultaneously (this is a 3 key rollover). Another typical example is typing an upper case letter by hitting the shift key and a letter key at the same time (this is 2 key roll over). A keyboard controller with N-key rollover detects the simultaneous operation of N keys and processes the appropriate signals.

The present embodiment is fully power managed. That is, it can be put in standby mode and can detect any-key resume without the clocks running. Thus, it does not need a clock running when it is in standby mode and thereby saves additional power.

The cache based scan matrix keyboard controller system is scaleable and adaptable to different key switch technologies or matrix configurations. For example, if the cache based scan matrix keyboard controller system is being implemented in a smart cell phone, it will typically have a 5 row by 5 column switch matrix. However, if the cache based scan matrix keyboard controller is being utilized in a computer system keyboard, it will typically have 101 keys and a 16 row by 16 column switch matrix.

Figure 2:
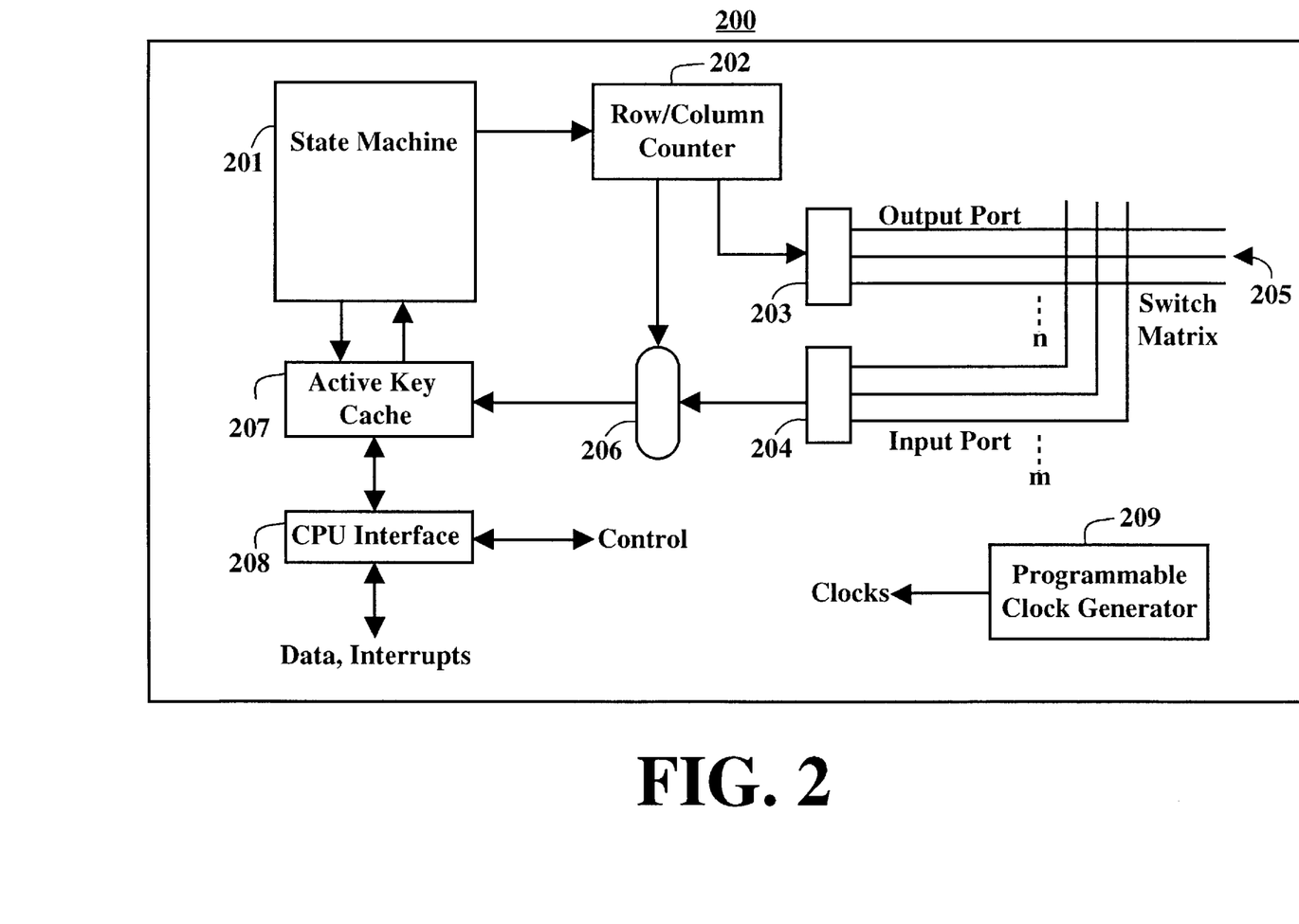
FIG. 2 is a schematic diagram of one embodiment of the present invention (a cache based scan matrix keyboard controller system).

FIG. 2 shows one embodiment of a cache based scan matrix keyboard controller system 200. Cache based scan matrix keyboard controller system 200 comprises a state machine 201, a row/column counter 202, an output port 203, an input port 204, a switch matrix 205 (comprising n rows and m columns), a junction 206, an active key cache 207, a CPU interface 208, and a programmable clock generator 209. Row/column counter 202 is coupled to output port 203 and junction 206. Output port 203 is coupled to switch matrix 205, which is coupled to input port 204. In addition, junction 206 is coupled to input port 204 and active key cache 207, which, in turn, is coupled to CPU interface 208. Programmable clock generator 209 produces clock pulses for the various parts of cache based scan matrix keyboard controller system 200.

State machine 201 is adapted to sequence the cache based scan matrix keyboard controller system 200 through its operation. State machine 201 determines the operating mode (normal or standby), directs generation of row and column addresses (the keyboard is seen as a matrix of rows and columns) and determines correct cache behavior. It also initiates information exchange with a CPU through CPU interface 208.

CPU interface 208 is adapted to permit communication between a CPU and cache based scan matrix keyboard controller system 200. In the present embodiment, CPU interface 208 comprises a plurality of registers, including for example, an interrupt mechanism. CPU Interface 208 accepts signals from the CPU that are utilized in managing and controlling the operation of the cache based scan matrix keyboard controller system 200. Data, interrupts and active key information from the cache based scan matrix keyboard controller system 200 are transmitted through the CPU interface 208 to the CPU.

In the present embodiment, switch matrix 205 comprises a plurality of switches arranged in 16 columns and 16 rows. Each switch is connected to an electrically conductive line (hereafter referred to as a line) in each row and to a line in each column at the intersection of each row and column. A switch is activated (closed) by pressing a key. When a switched is activated, the lines in the row and column connected to the switch are electrically coupled.

Under direction from the state machine 201, row/column counter 202 generates addresses for rows and columns associated with switch matrix 205. In the present embodiment, the row/column counter 202 comprises a series of incrementers which can generate bit patterns representing addresses or sequential rows and columns of switch matrix 205. The column address identifies a particular column of switch matrix 205. The row address identifies a particular row of switch matrix 205.

Output port 203 drives signals on the lines in the rows of switch matrix 205 to the columns. Output port 203 drives these signals on a particular line in a row of switch matrix 205 as that particular line's address is transmitted by the row/column counter 201. In the present embodiment, output port 203 has a controlled output slew rate to reduce electrical noise within the switch matrix 205.

Input port 204 accesses each of the lines in the columns of switch matrix 205. Input port 204 accesses each line in a column of switch matrix 205 as that particular line's address is transmitted by the row/column counter 201. After accessing a line, Input port 204 senses if the signal on the line is low. Since the rows will be undriven if no switch in switch matrix 205 is closed, a pull-up resistor is coupled to each line in a row (a pull up resistor is attached to each input line).

Active key cache 207 maintains the state of keys that are currently in use (being pressed or released). It should be noted that in some embodiments active key cache 207 may be required to track a number of active keys. In this embodiment active key cache 207 is a fully associative cache.

A cache based scan matrix keyboard controller system operates by transmitting a series of signals through a switch matrix, scanning the outputs of the switch matrix to determine if any signals passed through an activated (closed) switch, entering the state of the switch in a key cache and transmitting appropriate signals to a CPU. For example, in the present embodiment, state machine 201 directs row/column counter 202 to transmit to output port 203 and input port 204 the address of a particular column and row in switch matrix 205. Output port 203 drives a zero to the column identified by the address transmitted by the row/column counter 202. If the switch at the intersection of the addressed column and row is closed, it will connect the pull-up resistor to the driven zero on output port 203 and input port 204 row will go low. Thus, if there is a zero on a row and a column, then the switch connecting that row and column is closed. If there is not a zero on a row and a column, then the switch connecting that row and column is open. The state of the key is loaded in active key cache 207.

Keys are typically in one of several states, including: inactive state, first make, make debounce, typematic mode, break state, and break debounce state. In the inactive state the key contacts are open and the key isn't being used. In the first make state when a key is first pressed, a make event for that key is sent to the CPU. Most switches incur some bounce characteristics after they are first activated. Even though this bouncing occurs rapidly in a short period of time, most computer systems are able to detect theses bounces and some measures must be taken to eliminate erroneous make signals associated with the bounces. In the make debounce state, for a short period of time after the first make, transitions of the key switch are ignored. In other instances when the key is held down for a relatively long period of time, automatically repeated make signals are desirable. If the typematic mode is enabled and the key is being pressed continuously in a typematic mode state, repeated automatic make events will be sent to the CPU while the key is held down. In the break state, when a key is released, a break event for that key is sent to the CPU. In the break debounce state, for short period after the break, transitions of the key switch are ignored (again to eliminate erroneous signals).

The keys are in an inactive state when the computer system is in standby mode. Standby mode is initiated by the CPU setting a bit in the CPU interface registers and all rows are actively driven low. In addition, the active key cache valid bits are cleared and the programmable clock generator is disabled (clocks must start and stop cleanly). Power consumption drops to near zero, since the design is static.

In the present embodiment, the any-key resume feature operates in the following manner. If a key is pressed while the cache based scan matrix keyboard controller system is in standby mode; the clock generator is restarted, the state machine begins its sequence, and the CPU interface transmits a make event to the CPU for the pressed key. The first key pressed also triggers an interrupt to the CPU that wakes up the entire system. As indicated above, in standby mode all rows are low. Thus, when any key is pressed it will drive at least one column low. In one embodiment, a logic component is coupled to all the rows and if any key is being pushed the output of the logic component will trigger the interrupt. For example, the logic component may be an "AND" gate. The number of inputs to the "AND" gate is the same as the number of rows, in the present embodiment there are sixteen rows.

Figure 3:
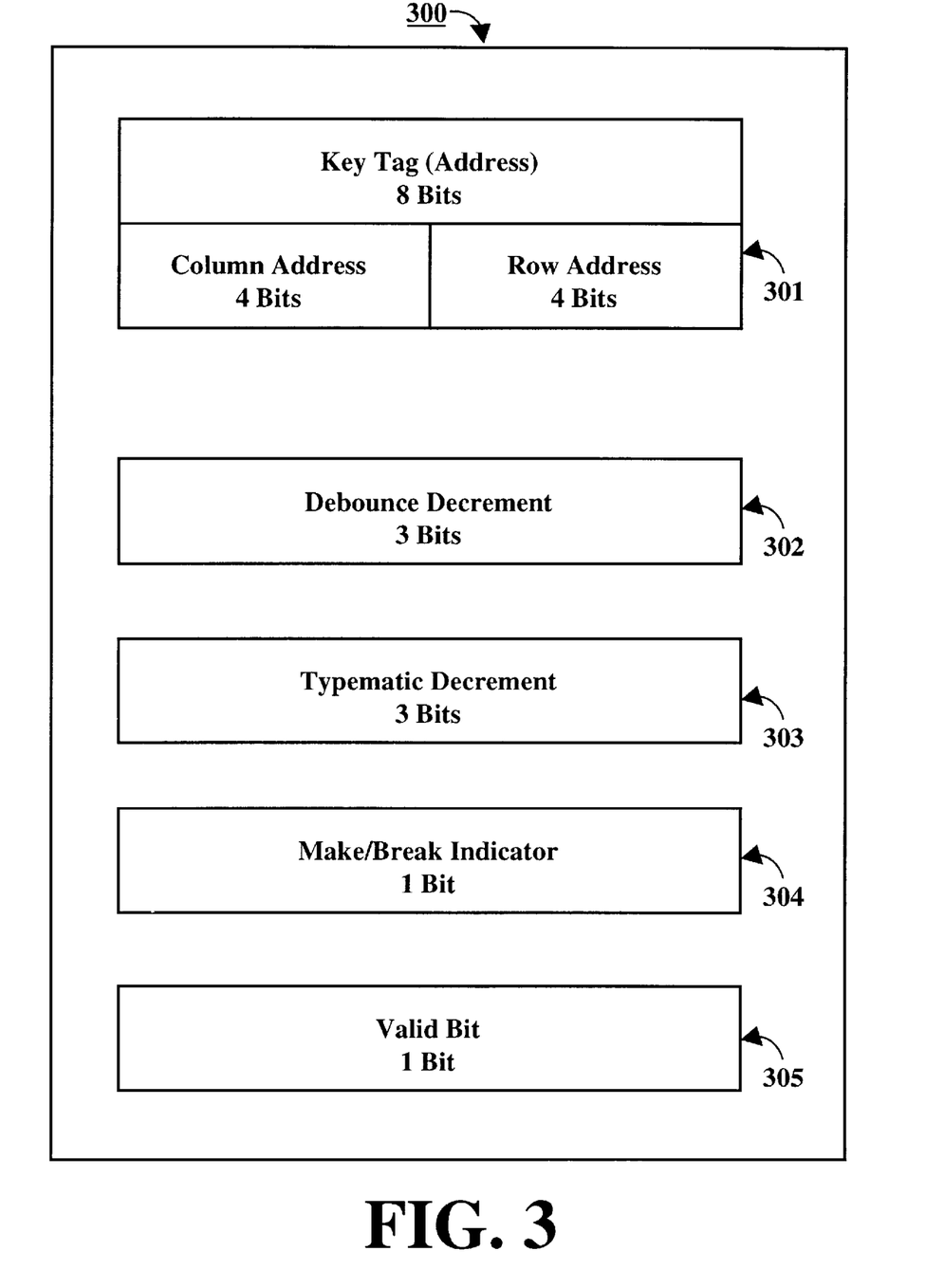
FIG. 3 is a schematic diagram illustrating one embodiment of the present active key cache entry system.

Referring now to FIG. 3, an active key cache entry format 300 for tracking the state of a key in the present embodiment is shown. Operating a keyboard typically involves pressing a series of keys, either one key at a time or multiple keys simultaneously. For example, the operator hits a key or a combination of keys concurrently (shift-alt-delete, etc.) and then releases them. As previously indicated the cache based scan matrix keyboard controller system has a N-key roll over capability and active key cache 207 can track the state of multiple simultaneously active keys. In the present embodiment, active key cache is a three set cache, where each set stores the behavior of one key in accordance with active key cache entry format 300. Active key cache entry format 300 comprises key tag 301, debounce decrement 302, typematic decrement 303, make/break indicator 304 and valid bit 305.

The first entry in active key cache entry format 300 is key tag 301, which indicates the address of an active key. Key tag 301 is used to retain the fact that a particular key is active. In the present embodiment, key tag 301 comprises eight bits, which means 256 distinct addresses are available. As indicated previously, switch matrix 205 comprises a series of rows and columns with switches connected to the intersections of each row and column. Thus, with 256 distinct key tag 301 addresses available, the present active key cache 207 can accommodate a matrix comprising 256 keys, arranged as 16 columns by 16 rows. This is a large number of keys, but the design of the present embodiment is clearly scaleable to smaller or larger switch matrices, including for example, asymmetrical matrices.

The debounce decrement 302 is used to determine a debounce delay period. The debounce delay period is the time from the first transition of that key until the state should be considered valid (stable). For example, if there is an indication that a switch in the switch matrix is open followed by an indication it is closed, or vise versa, there will be a period of time before the bouncing stops. This typically takes about 40 ms but varies depending on the quality of the key. A poorer quality switch may require a longer time. The value in debounce decrement 303 establishes a number from which a decrementer counts down (i.e. from 111 to 000) after a key has been pressed or released. If the value in the debounce decrement 303 is large enough the time required to count down to zero will be longer than the time it takes a switch to stop bouncing. During the period of time it takes a debounce decrementer to count down, no events for the particular activated key(s) may be sent to the CPU, regardless of any transitions of the switch associated with the particular activated key(s). This time period permits noise associated with bouncing to be effectively removed from the key's operation.

In the present embodiment, the debounce decrement value is set for a binary value of 111, which takes about 50 ms to decrement down to zero. The greater the value of debounce decrement entry 302, the longer it takes to decrement, thus the longer the time period it represents. The debounce delay may optionally operate on its own clock from programmable clock generator 209.

The typematic decrement 303 is used to determine a typematic delay period. The typematic delay period is the time between the first make of a switch and the time cache based scan matrix keyboard controller system 200 automatically starts sending make events to the CPU because a key is being held down for a relatively prolonged period. The value in debounce decrement 303 establishes a number from which a decrementer, using a separate clock, counts down after a make event for a particular key has been transmitted to the CPU.

In the present embodiment, the typematic decrement 303 value is set for a binary value of 111, which takes about 50 ms to decrement down to zero. When typematic decrementer reaches zero (000), cache based scan matrix keyboard controller system 200 sends an appropriate signal to the CPU. For example, if after the typematic decrementer has counted down to zero and the key is still detected as pushed, an automatic make event signal is sent. The typematic decrement 303 value is repeatedly reset to 111 and counts down again until the key is released. If a key release has been detected a break event signal is sent. Additionally, in the present embodiment only one key or set of keys may be in typematic mode at any time and the CPU may enable or disable typematic mode via CPU interface 208.

Make/break indicator 304 reflects the state of the switch corresponding to the key addressed at the time, whether it has transitioned from pressed to released or vice versa. In the present embodiment make/break indicator 304 is a signal bit. A low signal (logical 0) indicates the key is open, a high signal (logical 1) indicates the key is closed.

Valid bit 305 indicates the cache entry is valid. In the present embodiment, valid bit 305 is one bit. This bit reflects the state of an entry in the active key cache 207, it indicates if a cache entry is being used or not. State machine 201 utilizes the value in valid bit 305 to identify an unused cache entry. In the present embodiment, when a low signal (logical 0) is issued the cache entry is not valid and may be used by the next active key transition. When a high signal (logical 1) is issued, the cache entry is valid and is retained for use by the key identified in the key tag field 301.

Figure 4:
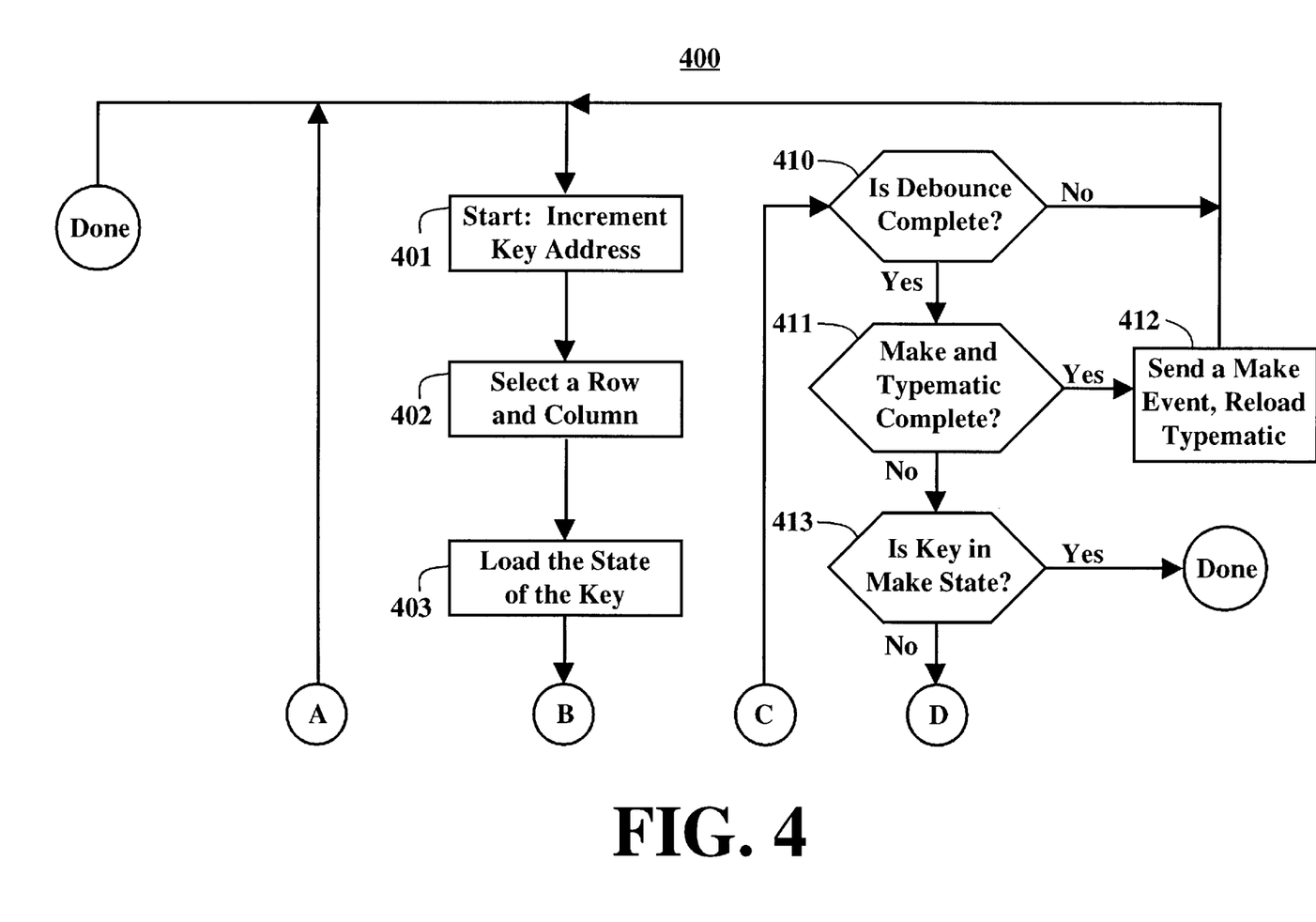
FIG. 4 illustrates a process 400, performed in accordance with one embodiment of a cache based scan matrix keyboard controller.

Referring now to FIG. 4, a flow chart illustrating a process 400 is shown. Process 400 comprises steps of an operating process for one embodiment of a cache based scan matrix keyboard controller process (for example cache based scan matrix keyboard controller system 200 from FIG. 2). The process begins with step 401.

In step 401, the process is started by preparing (incrementing) a key address. Preparing the key address in effect determines which key is to be canned.

In step 402, a key address is used to determine which column an output port should drive low and which row an input port should scan. As previously discussed, the key address is essentially divided into a row component and a column component. The column corresponding to a column address component is driven low by an output port. The row corresponding to a row address component is scanned by an input port to determine if a switch coupled between an addressed row and column has been activated.

In step 403, the state of a key identified by a key address is loaded in a state machine. The state of the key is either pressed or released (on or off). Thus, the state machine has only to examine one particular bit to determine if it is on or off. However, the history of that one particular bit may be quite elaborate and is captured by an active key cache.

In step 404, a cache based scan matrix keyboard controller system determines if a currently addressed key is in an active key cache. The active key cache is used to track the behavior of the currently addressed key. If the currently addressed key is in the active key cache, the process proceeds to step 410. If the currently addressed key is not in the active key cache the process proceeds to step 405.

In step 405, a cache based scan matrix keyboard controller system examines the state loaded in step 403 to determine if a key is pressed. If a key is not pressed the cache based scan matrix keyboard controller system is essentially not interested in that key. The cache based scan matrix keyboard controller system disregards that key and starts over at step 401. However, if an addressed key is pressed the process proceeds to step 406.

In step 406, the process determines whether there is enough storage room in an active key cache to hold an addressed key. In the present embodiment, there is three key roll over so there is a three entry cache and generally there will be enough room. However, if four keys are hit at once, the fourth key will overload the active key cache. In other words, there is not enough room in the active key cache and the process returns to step 401 and continues with the next key in the matrix. If there is enough room in active key cache the process proceeds to step 407.

Step 407 is the initial step in the loop that loads a key tag in an active key cache. The key tag is set to correspond to the address of a pressed key. Then a valid bit is set to indicate this is a good cache entry.

In step 408 a make signal is sent to the CPU and the make/break bit is set to the make state. This signal indicates to the CPU that a key has been pressed and identifies the key.

In step 409 debounce and typematic decrementers are loaded with a value (number). In the present embodiment, decrementers are used because it is easier to load any number and decrement down until it reaches zero. Thus, regardless of what number is loaded in the decrementer, every time the cache based scan matrix keyboard controller system only has to detect a zero. It should be appreciated that other embodiments utilizing incrementers or other decrementers are possible. However, if an incrementer is used, the system will have to also be capable of testing for various values depending on the value entered in the incrementer. In the present embodiment, when the decrementers are loaded, the process returns to step 401 to start over again.

By starting process 400 over again, the cache based scan matrix keyboard controller system increments a key address and scans the next key in the sequence. This continues until an activated key is detected. If the activated key is not loaded in the active key cache (e.g. step 404), the process proceeds as described above. However, if the activated key is the same key as the previously activated key and the result of step 404 indicates the key is loaded in the active key cache, the process proceeds to step 410.

In step 410, the debounce decrementer is checked to determine if the debounce cycle is complete. The debounce decrementer runs independently of the state machine, it is on a separate clock. So the state machine itself does not change the state of the debounce decrementer, rather the debounce decrementer runs autonomously. If the debounce is not complete then the cache based scan matrix keyboard controller system is not interested in what the currently addressed key is doing because it could still be bouncing. Eventually, the debounce cycle will be finished and process proceeds to step 411.

In step 411, a cache based scan matrix keyboard controller system determines if an addressed key is made (pressed) and if a typematic decrementer has completed its cycle. For example, if the same key is being pressed and the typematic decrementer has completed its cycle, then the user is assumed to be intentionally holding the key down and the process proceeds to step 412.

In step 412, a cache based scan matrix keyboard controller system generates another make event and a typematic decrementer is reloaded. When step 412 is complete the process returns to step 401. This loop from step 410 through step 412 is repeated while the same key is held down. The typematic decrementer is similar to the debounce decrementer in that it is completely autonomous and does not have to be controlled by the state machine.

It should be appreciated that there are other embodiments of the present invention not shown so as not to unnecessarily obscure the invention. For example, one ordinarily skilled in the art would recognize that logic to create an initial pause before beginning the typematic feature could easily be added to the present embodiment. An example of this feature could be implemented by having the initial cycle of the typematic decrementer be a higher value than subsequent cycles. Another embodiment could be implemented by establishing a cycle time (repeat rate) with an initial period (pause) before starting the cycle time. In addition, it should be noted that the cache based scan matrix keyboard controller system is programmable.

In step 413 a cache based scan matrix keyboard controller system determines if a key is still made (pressed). If the key is still made at this point it means the cache based scan matrix keyboard controller system is still waiting for a typematic decrementer to complete its cycle. In other words the key is still made but it is too soon to send an automatic make because enough time has not passed to make a reasonable assumption that the user is intentionally pressing the key. Thus, if the key is made the process returns to step 401. If the test i n step 413 is negative and the key is not made, it means t he key has been released and the process proceeds to step 414.

In step 414 a debounce decrementer is reset and the process proceeds to step 415. Resetting the debounce decrementer ensures that switch bounce noise will not be erroneously transmitted to a CPU.

In step 415 a cache based scan matrix keyboard controller system determines if a debounce decrementer is complete. If it is not complete, the process returns to step 410. If it is complete, the process proceeds to step 416.

In step 416 a cache based scan matrix keyboard controller system determines if a make/break indicator has been set in the break state. Or another way to accomplish this is to add one more bit (an additional flip flop) to each cache entry indicating that a break event had already been sent. If the make/break indicator has not been set in the break state, then the process proceeds to step 418. If the make/break indicator has been set in the break state, then the process proceeds to step 417.

In step 417 the valid bit is cleared and the process returns to step 401. This indicates to a cache based scan matrix keyboard controller system that an active key cache is available to store information regarding a key.

In step 418 a signal indicating a break event is sent to a CPU and the process returns to step 401. This indicates to the CPU that a key is no longer being pressed.

The present invention is a novel solution for the replacement of the traditional microcontroller-based keyboard controller. The cache based scan matrix keyboard controller system is capable of being implemented as an all-hardware solution, yet, requiring orders of magnitude less silicon gates. Thus, the present invention is less expensive to design and manufacture and operates more efficiently. It requires less power than traditional keyboard systems and removes the bulk of keyboard management from the CPU. The cache based scan matrix keyboard controller system of the present invention provides a variety of useful features, including those described earlier, such as standby power management and any-key wake up.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A keyboard controller system comprising:
    a keyboard with a plurality of keys;
    a key matrix coupled to the plurality of keys for generating a signal when one of said plurality of keys is activated;
    an output port coupled to the matrix;
    an input port coupled to the matrix;
    a cache memory component that receives signals from the key matrix wherein the cache stores the signal and identifies which of the plurality of keys is actuated; and
    a state machine coupled to the cache memory and the key matrix wherein the state machine efficiently controls the keyboard.

2. The keyboard controller system of claim 1, wherein:
    said switch matrix includes a plurality of switches and electrically conductive lines arranged in rows and columns, one of said plurality of switches coupled to said electrically conductive lines at the intersection of each row and column, one of said plurality of switches coupled to one of said plurality of keys;
    said output port coupled to said rows of electrically conductive lines, said output port drives signals on said rows;
    said input port coupled to said columns of electrically conductive lines, said input port scans said columns for signals;
    a row/column counter coupled to said switch matrix, said row/column counter receives direction from said state machine, said row/column counter further generates addresses for said plurality of switches;
    a CPU interface coupled to said switch matrix, said CPU interface communicates with a central processing unit, and;
    a clock generator coupled to said state machine.

3. The keyboard controller system of claim 2, wherein said cache memory component comprises a plurality of data entry fields.

4. The keyboard controller system of claim 3, wherein the data entry fields includes:
    a key tag data field, said key tag data field stores an address of one of said plurality of keys;
    a debounce decrement data field, said debounce decrement data field stores an initial debounce decrementing value;
    a typematic decrement data field, said typematic decrement data field stores an initial typematic decrementing value;
    a make/break data field, said make/break data field stores the state of the key addressed in said key tag data field; and
    a valid bit data field, said valid bit data field stores data indicating if one of said plurality of data entry fields is being used.

5. The keyboard controller system of claim 4, wherein said state machine is receives said value stored in said debounce decrement data field and decrement the value to zero, said keyboard controller system is adapted to prevent communication of a make or break signal to a CPU until after said value stored in said debounce decrement data field has been decremented to zero and one of said plurality of said keys is still being pressed.

6. The keyboard controller system of claim 4, wherein said state machine is receives said value stored in said typematic decrement data field and decrement said value to zero, said CPU interface sends additional make signals to said central processing unit if said value stored in said typematic decrement data field has been decremented to zero and said one of said plurality of keys is still being pressed.

7. The keyboard controller system of claim 4, wherein said state machine is receives said value stored in said make/break data field and determine if one of said plurality of keys identified in said key tag data field is in a make state or a break state.

8. The keyboard controller system of claim 3, wherein said keyboard controller system provides more than one key roll over capability, wherein said multiple key roll over capability permits multiple of said plurality of keys to be pressed simultaneously to indicate that a particular character or function is to be signaled to said central processing unit.

9. The keyboard controller system of claim 3, further comprising:
    an any-key resume means wherein said resume means wakes a system from a suspended state; and
    a logic component to scan a plurality of switch matrix lines simultaneously and determine if any of said plurality of switch matrix lines contain a signal indicating whether one of said plurality of keys has been pressed, wherein said signal triggers said any-key resume means.

10. In a keyboard system comprising a plurality of keys, a cache memory component, and a state machine, a method of operating the keyboard by the state machine comprising the steps of:
    determining if a key is pressed;
    loading data regarding the pressed key into the cache memory;
    determining which key is pressed; and
    sending an appropriate signal to a CPU which is indicative of the key pressed.

11. The keyboard process of claim 10, further comprising the step of:
    d) starting a debounce decrementer; and
    e) checking if a debounce decrementer has completed a cycle.

12. The keyboard process of claim 11, further comprising the steps of:
    f) triggering a typematic decrementer; and
    g) analyzing if a typematic decrementer has completed a cycle.

13. The keyboard process of claim 12, further comprising the steps of:

h) resetting a valid bit entry in said cache memory component.

14. The keyboard process of claim 13, further comprising the steps of:

i) receiving a standby mode command from the CPU;

j) driving signals from said keys low;

k) clearing a valid bit entry in said cache memory component; and    l) disabling a clock generator.

15. The keyboard process of claim 14, further comprising the steps of:

m) starting said clock generator; and n) beginning a logic unit sequence.

16. In a keyboard system including a keyboard, plurality of keys, an active key cache, a state machine, a switch matrix and a CPU interface; a keyboard process comprising the steps of:

a) preparing a key address that indicates which of said plurality of keys is currently being analyzed;

b) selecting a row in said switch matrix and driving said key low;

c) scanning a column in said switch matrix to determine if a low signal has been driven onto it;

d) loading the state of a key if said key is pressed;

e) determining if a pressed key is in a active key cache;

f) setting a key tag entry and a valid bit entry in said active key cache for said pressed key;

g) sending a make signal to said CPU and setting a make state entry in said active key cache;

h) starting a debounce decrementer;

i) triggering a typematic decrementer;

j) checking if a debounce decrementer has completed a cycle;

k) analyzing if a typematic decrementer has completed a cycle;

l) deciding if said key is in a make state;

m) resetting a valid bit entry in said active key cache; and n) transmitting a break signal to said CPU.

17. The keyboard process of claim 16, further comprising the steps of:

o) receiving a standby mode command from said CPU;

p) driving a column low;

q) clearing a valid bit entry in said active key cache; and r) disabling a clock generator.

18. The keyboard process of claim 17, further comprising the steps of:

s) starting said clock generator; and t) beginning a state machine sequence.

\* \* \* \* \*